United States Patent
Goto

[11] Patent Number: 6,166,978
[45] Date of Patent: Dec. 26, 2000

[54] SEMICONDUCTOR DIFFERENTIAL AMPLIFIER HAVING A GAIN CONTROLLED BY A MEMORY TRANSISTOR

[75] Inventor: Mitsuhiko Goto, Chiyoda-ku, Japan

[73] Assignee: Nippon Steel Corporation, Tokyo, Japan

[21] Appl. No.: 09/033,081

[22] Filed: Mar. 2, 1998

[30] Foreign Application Priority Data

May 13, 1997 [JP] Japan ......................................... 137745
Feb. 2, 1998 [JP] Japan ......................................... 20786

[51] Int. Cl.[7] ...................................................... G11C 7/02
[52] U.S. Cl. ................ 365/207; 365/185.21; 365/189.09
[58] Field of Search .................................... 327/563, 562, 327/561, 52, 53; 330/254, 278, 279, 280; 365/185.01, 185.26, 207, 208, 185.21, 104, 189.09

[56] References Cited

U.S. PATENT DOCUMENTS

| 4,916,665 | 4/1990 | Atsumi et al. ............................ 365/185 |
| 5,598,122 | 1/1997 | McClure .................................. 327/538 |
| 5,617,355 | 4/1997 | Kohno ................................. 365/185.21 |
| 5,912,838 | 6/1999 | Chevallier ........................... 365/185.03 |

*Primary Examiner*—David Nelms
*Assistant Examiner*—Thong Le
*Attorney, Agent, or Firm*—Pollock, Vande Sande & Amernick, RLLP

[57] ABSTRACT

A semiconductor device includes a differential amplifier, a current mirror circuit and a control current supply circuit. The amplifier has a first and a second transistor forming an input differential pair, the first transistor having a first gate and a first and a second impurity diffusion layer, the second transistor having a second gate and a third and a fourth impurity diffusion layer. The current mirror circuit has a third and a fourth transistor, the third transistor having a third gate and a fifth and a sixth impurity diffusion layer, the fourth transistor having a fourth gate and a seventh and an eighth impurity diffusion layer. The control current supply circuit has a non-volatile memory transistor having a control gate, a charge accumulating layer and a ninth and a tenth impurity diffusion layer. The first and the fifth impurity diffusion layers and the third and the fourth gates are connected to each other via a first wiring layer. The third and the seventh impurity diffusion layers are connected to each other via a second wiring layer. The sixth and the eighth impurity diffusion layers are connected to a first constant voltage supply via a third wiring layer. And, the second and the fourth impurity diffusion layers are connected to a second constant voltage supply via at least a fourth wiring layer, the first control current supply circuit and a fifth wiring layer.

42 Claims, 5 Drawing Sheets

SEMICONDUCTOR DIFFERENTIAL AMPLIFIER HAVING A GAIN CONTROLLED BY A MEMORY TRANSISTOR

BACKGROUND OF THE INVENTION

The present invention relates to a semiconductor device with memory transistors. Particularly, this invention relates to a semiconductor device with memory transistors applicable to a gain-programmable amplifier, etc.

FIG. 1 shows a circuit diagram of a conventional differential amplifier with differential inputs and a single output for various analog signal processing, such as audio signal processing.

As shown in FIG. 1, input transistors 1 and 2 are connected to each other for differential amplification of input voltages Vine and Vine. The input transistors 1 and 2 are complementary conductance- and gain-variable devices. The sources of the input transistors 1 and 2 forming an input differential pair are connected together and further connected to a constant voltage supply Vas via a current supply transistor 5 as a control current supply device. In the drawing, Ice denotes a supply current.

The drains of the transistors 1 and 2 are connected to the drains of transistors 3 and 4, respectively. The transistors 3 and 4 form a current mirror circuit as an active load of the differential pair of the transistors 1 and 2. A current Iou is output from the drain of the transistor 2. The sources of the transistors 3 and 4 are connected together and further connected to a constant voltage supply Vd.

The entire circuit shown in FIG. 1 is assembled to an integrated differential amplifier.

The input and output characteristics of the differential amplifier depends on the supply current decided by the current supply transistor and the differential input voltages, and is expressed by $$Iou\ (Vine-Vine+Vos) \times Ice$$

where Vos denotes a difference between threshold voltages of the input transistors 1 and 2 and is an input offset voltage of the differential amplifier.

The Japanese Patent Laid-Open Nos. 63(1988)-3503 and 4(1992)-192703 disclose circuitry with a transistor having a floating gate for varying the input and output characteristics of the differential amplifier described above.

Here, input and output characteristics of the differential amplifier are expressed by $$Iou\ (Vine-Vine) \times Ice$$

and hence the input offset voltage becomes zero with no variation and signal fluctuation can be restricted.

However, in case of audio signals, a sound having a frequency of zero Hz (i.e., d.c.) cannot be heard. Hence, a direct current obtained by controlling an amplifier for amplifying an audio signal so that input offset voltage is zero is of no importance. In other words, the amplitude varying function is more important than the input offset voltage controlling function for audio signal processing.

For varying amplitude of an amplifier, gain programmable amplifiers with feedback circuitry have been provided. However, the feedback circuitry outputs a voltage that must be converted into a current. Therefore, this type of amplifiers require a voltage-to-current converter, and hence result in complex amplifier circuitry.

SUMMARY OF THE INVENTION

The present invention provides a semiconductor device with memory transistors applicable, for example, to a gain-programmable amplifier used for processing analog signals, such as audio signals.

The present invention provides a semiconductor device comprising: a first differential amplifier including a first and a second transistor forming an input differential pair, the first transistor having a first gate and a pair of conductive areas of a first and a second conductive area, the second transistor having a second gate and a pair of conductive areas of a third and a fourth conductive area; a first current mirror circuit including a third and a fourth transistor, the third transistor having a third gate and a pair of conductive areas of a fifth and a sixth conductive area, the fourth transistor having a fourth gate and a pair of conductive areas of a seventh and an eighth conductive area; and a first control current supply circuit including a first non-volatile memory transistor having a first control gate, a first charge accumulating layer and a pair of conductive areas of a ninth and a tenth conductive area, wherein the first and the fifth conductive areas and the third and the fourth gates are connected to each other via a first wiring layer, the third and the seventh conductive areas are connected to each other via a second wiring layer, the sixth and the eighth conductive areas are connected to a first constant voltage supply via a third wiring layer, and the second and the fourth conductive areas are connected to a second constant voltage supply via at least a fourth wiring layer, the first control current supply circuit and a fifth wiring layer.

Further, the present invention provides a semiconductor device comprising: a differential amplifier including a transistor having a gate and a first pair of conductive areas; a control current supply circuit including a non-volatile memory transistor having a control gate, a charge accumulating layer and a second pair of conductive areas; and means for varying a threshold voltage of the non-volatile memory transistor, wherein one conductive area of the first pair is connected to a constant voltage supply via at least a first wiring layer, the control current supply circuit and a second wiring layer.

Further, the present invention provides a semiconductor device comprising: a pair of differential input transistors connected to each other so as to differentially amplify an input signal; and a current supply having a non-volatile memory transistor, connected to the differential input transistors.

Further, the present invention provides a semiconductor device comprising: an amplifier; varying means for varying amplitude of the amplifier, the varying means including a memory transistor having a control gate, a charge accumulating layer, a source and a drain; and applying means for applying predetermined voltages to the control gate, the source and the drain, the applying means including means for changing, step-by-step, status of charges in the charge accumulating layer.

Further, the present invention provides a semiconductor device comprising: a variable resistor including a memory transistor having a control gate, a charge accumulating layer, a source and a drain; and applying means for applying predetermined voltages to the control gate, the source and the drain, the applying means including means for changing, step-by-step, status of charges in the charge accumulating layer.

Further, the present invention provides a semiconductor device comprising an amplifier including a non-volatile memory transistor having a control gate, a charge accumulating layer and a pair of conductive areas of a first and a second conductive area.

Further, the present invention provides a semiconductor device comprising: an amplifier including a non-volatile memory transistor and a first transistor, the non-volatile memory transistor having a control gate, a charge accumulating layer and a pair of conductive areas of a first and a second conductive area, and the first transistor having a first gate and a pair of conductive areas of a third and a fourth conductive area; and a current mirror circuit including a second transistor and a third transistor, the second transistor having a second gate and a pair of conductive areas of a fifth and a sixth conductive area, and the third transistor having a third gate and a pair of conductive areas of a seventh and an eighth conductive area, wherein the first and the sixth conductive areas and the second and the third gates are connected to each other via a first wiring layer, the third and the eighth conductive areas are connected to each other via a second wiring layer, the fifth and the seventh conductive areas are connected to a first constant voltage supply via at least a third wiring layer, and the second and the fourth conductive areas are connected to a second voltage supply via at least a fourth wiring layer.

Further, the present invention provides an amplifying circuit comprising a differential amplifier which includes: differential input transistors connected so as to differentially amplify two input signals; and a current supply transistor connected to the differential input transistors, wherein the current supply transistor is a non-volatile memory transistor.

Further, the present invention provides an amplifying circuit comprising: a differential amplifier including a first and a second transistor forming an input differential pair, the first transistor having a first gate and a pair of conductive areas of a first and a second conductive area, the second transistor having a second gate and a pair of conductive areas of a third and a fourth conductive area; and a current mirror circuit acting as an active load of the differential amplifier, including a third and a fourth transistor, the third transistor having a third gate and a pair of conductive areas of a fifth and a sixth conductive area, the fourth transistor having a fourth gate and a pair of conductive areas of a seventh and an eighth conductive area, wherein the first and the fifth conductive areas and the third and the fourth gates are connected to each other via a first wiring layer, the third and the seventh conductive areas are connected to each other via a second wiring layer, the sixth and the eighth conductive areas are connected to a first constant voltage supply via a third wiring layer, the second and the fourth conductive areas are connected to a second constant voltage supply via at least a fourth wiring layer, a non-volatile memory transistor acting as a control current supplying device and a fifth wiring layer, and a sixth wiring layer for outputting a current is connected to the third conductive area.

Further, the present invention provides a method of varying amplitude of a semiconductor having differential input transistors connected so as to differentially amplify two input signals, a non-volatile memory transistor as a current supply transistor connected to the differential input transistors and a selecting transistor connected between the differential input transistors and the current supply transistor, the method comprising the steps of: applying a first predetermined voltage to a gate of the current supply transistor; and applying a second predetermined voltage to either of two conductive areas of the selecting transistor, thus varying a threshold level of the current supply transistor.

Further, the present invention provides a computer readable medium storing program code means for causing a computer to vary amplitude of a semiconductor having differential input transistors connected so as to differentially amplify two input signals, a non-volatile memory transistor as a current supply transistor connected to the differential input transistors and a selecting transistor connected between the differential input transistors and the current supply transistor, comprising: first program code means for applying a first predetermined voltage to a gate of the current supply transistor; and second program code means for applying a second predetermined voltage to either of two conductive areas of the selecting transistor, thus varying a threshold level of the current supply transistor.

DETAILED DESCRIPTION OF PREFERRED EMBODIMENTS

Preferred embodiments of a semiconductor device with non-volatile transistors according to the present invention will be described with reference to the attached drawings.

Figure 1:
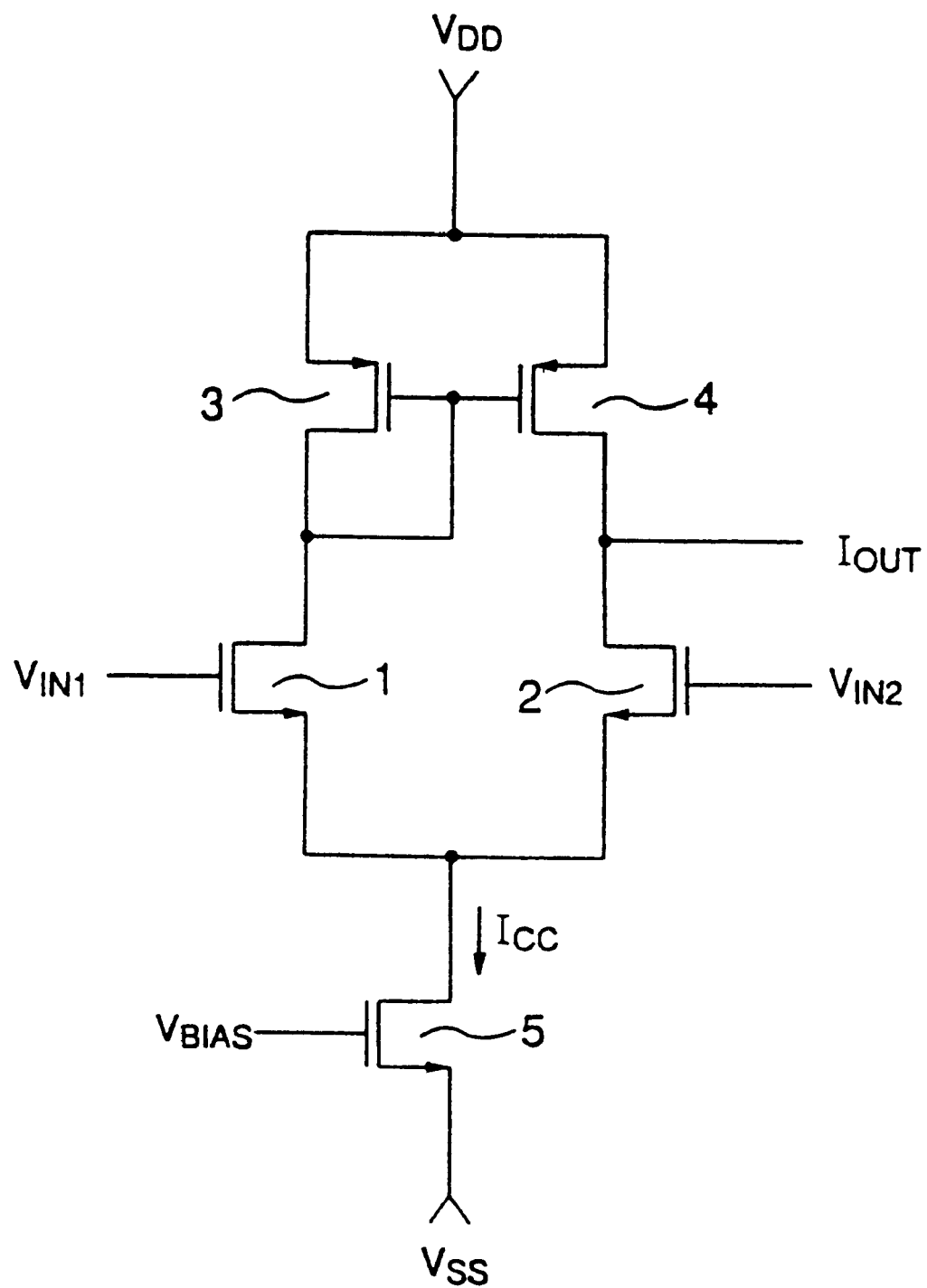
FIG. 1 is a schematic circuit diagram of a conventional differential amplifier.
Figure 2:
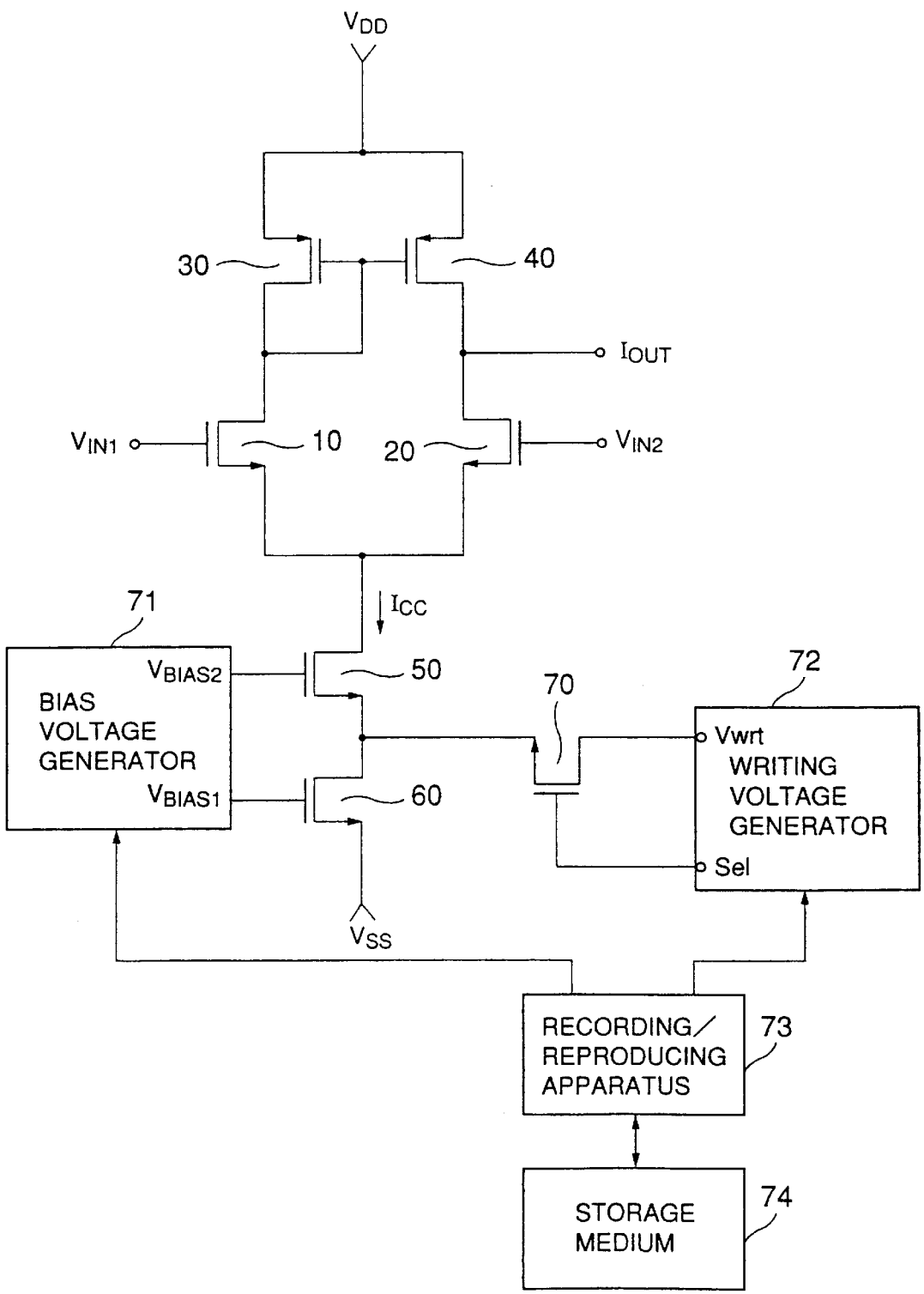
FIG. 2 is a circuit diagram showing essential portions of a programmable amplifier as the first preferred embodiment according to the present invention.

FIG. 2 shows an essential circuit diagram of a gain-programmable amplifier as the first embodiment.

As shown in FIG. 2, NMOS input transistors 10 and 20 are connected to each other for differential amplification of input voltages Vine and Vine. The input transistors 10 and 20 may be of non-volatile transistors or complementary conductance- and gain-variable devices.

The drains of the transistors 10 and 20 are connected to the drains of PMOS transistors 30 and 40, respectively. The transistors 30 and 40 form a current mirror circuit as an active load of the differential pair of the transistors 10 and 20. A current Iou is output from the drain of the transistor 20. The sources of the transistors 30 and 40 are connected together and further connected to a constant voltage supply Vd.

The sources of the input transistors 10 and 20 forming the input differential pair are connected together and further connected to a constant voltage supply Vas via a data-read protecting NMOS transistor 50 and a current supply NMOS transistor 60 as a control current supply device. The current supply transistor 60 is a non-volatile transistor with a floating gate. A data-selecting NMOS transistor 70 is connected to a node where the transistors 50 and 60 are connected to each other.

A MOS transistor is disclosed, for example, by Japanese patent Laid-open No. 1988(63)-81858. Further, a non-volatile memory transistor with a floating gate employed as the current supply transistor 60 is disclosed, for example, by Japanese patent Laid-open No. 1994(6)-268181.

As disclosed in the two Japanese laid-open patents, the drain and the source of each transistor are made of impurity diffusion layers. When the circuit of FIG. 2 is fabricated as an integrated circuit, connections among the sources and drains described above are made by connecting impurity diffusion layers to each other via wiring layers formed over the impurity diffusion layers.

The connections among impurity diffusion layers via wiring layers are also made in other embodiments described later, however, will not be shown. Because they are understandable for one skilled in the art without drawing.

Gallium arsenide FETs formed on a gallium arsenide substrate can be employed as the transistors shown in FIG. 2 and the other drawings instead of MOS transistors. In this case, the drains and the sources will be made of conductive layers (areas), corresponding to the impurity diffusion layers of a MOS transistor, in a shallow areas of the gallium arsenide substrate.

The transistors 30 and 40 can be of NMOS-type while the others PMOS-type with exchanging constant voltage supplies Vd and Vas with each other.

A writing voltage Vwrt supplied to the current supply transistor 60 via the data-selecting transistor 70 is controlled by a writing voltage generator 72 to set a threshold voltage Vtfg of the transistor 60 at a desired value.

The supply current Ice is varied by varying a threshold voltage Vtfg of the current supply transistor 60that is a non-volatile transistor with a floating gate to vary an amplitude (gain) of the differential amplifier.

The operation of the circuit shown in FIG. 2 will be explained.

In FIG. 2, a gate voltage Vbias2 of the data-read protecting transistor 50 is set at HIGH to be turned on by a bias voltage generator 71. Further, a gate voltage Sel of the data-selecting transistor 70 is set at LOW to be turned off. This makes the gain-programmable amplifier operate.

The input and output characteristics of the amplifier are expressed by $$Iou\ (Vine-Vine+Vos) \times Ice$$

where Vos denotes a difference between threshold voltages of the input transistors 10 and 20 and is an input offset voltage of the differential amplifier.

Here, the supply current Ice is expressed by $$Iou\ (Vbias1-Vtfg)^2$$

where Vbias and Vtfg denote a gate voltage and a threshold voltage, respectively, of the current supply transistor 60.

The supply current Ice is thus varied by varying the threshold voltage Vtfg of the current supply transistor 60.

The input and output characteristics are therefore expressed by $$Iou\ (Vine-Vine+Vos) \times (Vbias1-Vtfg)^2$$

which shows the amplitude can be programmably varied by varying the threshold voltage Vtfg.

Here, the input offset voltage Vos is not zero, however, the voltage Vos is not necessarily zero when the amplifier according to the present invention is applied to an audio signal amplifier, because the frequency of d.c. voltage is zero Hz and and cannot be heard.

If required, the input offset voltage Vos can be set at zero by employing transistors with a floating gate as the transistors 10 and 20 as the differential pair. In this case, the input and output characteristics of the differential amplifier are expressed by $$Iou\ (Vine-Vine) \times Ice$$

which indicates that the input offset voltage Vos is zero. It is achieved that no output signal range fluctuates.

Further, the data-read protecting transistor 50 is provided between the differential input transistors 10 and 20 and the current supply transistor 60 as shown in FIG. 2. The drain voltage of the transistor 60 with the floating gate is restricted to be too high by driving the transistor 50 under the common-gate connection. It is thus achieved that the threshold voltage change (amplitude change) of the transistor 60 called read disturbance by reading operation is restricted. The data memory deterioration is therefore restricted.

When varying the threshold voltage Vtfg of the current supply transistor 60 with a floating gate: by the vias voltage generator 71, a gate voltage Vbias1 of the current supply transistor 60 is set at HIGH to be turned on, and a gate voltage Vbias2 of the read protecting transistor 50 is set at LOW to be turned off. A gate voltage Sel of the data-selecting transistor 70 is set HIGH to make the transistor 60 execute data writing. While data writing is executing, a writing voltage Vwrt of the transistor 60 is controlled by the writing voltage generator 72 to control the amount of charges accumulated in the floating gate (charge accumulating layer) of the transistor 60 to set the threshold voltage Vtfg of the transistor 60 at a desired value.

A programming circuit disclosed in Japanese Patent Laid-Open No. 6(1994)-282992, for instance, can used as the bias voltage generator 71 and the write-voltage generator 72. The programming circuit generates multilevel writing voltages to vary, in a stepwise fashion, the status of charges accumulated in the floating gate of the current supply transistor 60.

As described above, according to the first embodiment, a gain-programmable amplifier is achieved that is applicable, for example, to a differential amplifier that is an essential component of a signal processing circuitry for audio signals by using a non-volatile transistor as the current supply transistor 60, having a threshold voltage-variable floating gate, thus an amplitude of the differential amplifier being programmably varied.

Further, according to the first embodiment, threshold variation of the non-volatile transistor as the current supply transistor 60 can be restricted during data reading, thus restricting amplitude variation.

The second preferred embodiment will be described with reference to FIGS. 3 and 4. These figures show a filter circuit with the differential amplifier according to the first embodiment, applicable to an audio signal processing circuitry, for instance.

Figure 3:
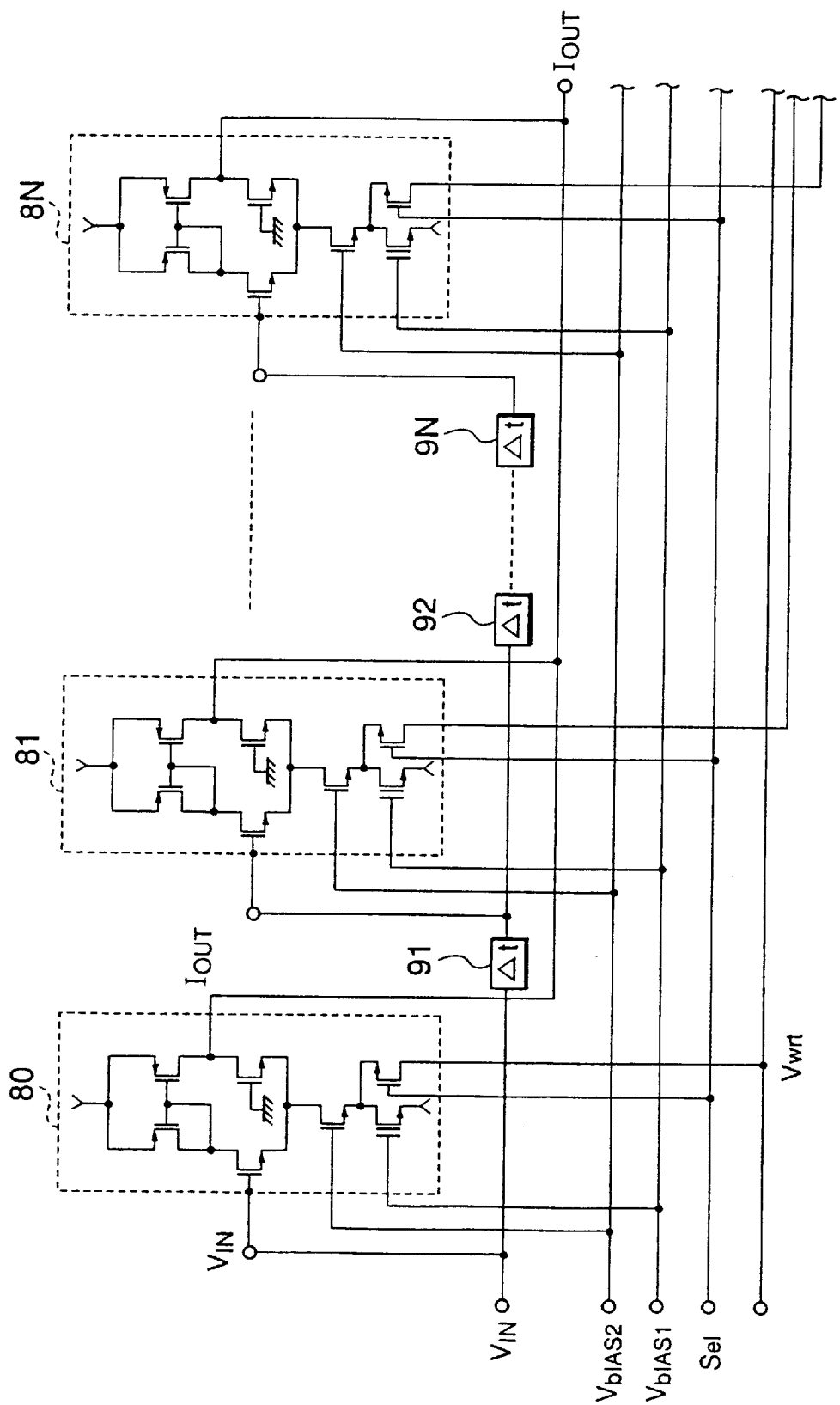
FIG. 3 is a circuit diagram showing an audio signal processing circuit using the programmable amplifier of FIG. 2, as the second preferred embodiment according to the present invention.
Figure 4:
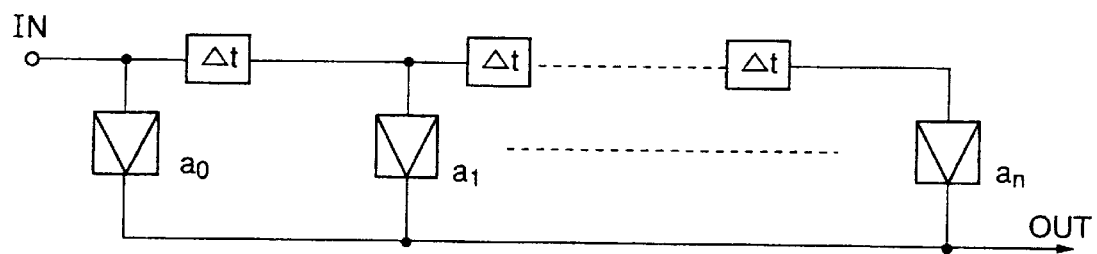
FIG. 4 is a functional block diagram of the audio signal processing circuit of FIG. 3.

FIGS. 3 and 4 show the circuit diagram and the functional block diagram, respectively. In FIG. 3, numerals 80, 81, . . . , 8N denote differential amplifiers each shown in FIG. 2. Further, in FIG. 3, numerals 91, 92, . . . , 9N denote delay circuits for delaying a signal by a predetermined period of time.

The N number of the differential amplifiers share signal lines that carry the input voltage Vin to the input transistor 10, the gate voltage Vbias1 of the current supply transistor 60, the gate voltage Vbias2 of the data-read protecting transistor 50, and the gate voltage Sel of the data-selecting transistor 70 shown in FIG. 2.

On the other hand, a signal line for carrying the writing voltage Vwrft to the current supply transistor 60 is provided to each differential amplifier.

In operation, the gate voltage Vbias2 of the read protecting transistor 50 is set at HIGH, thus the data-read protecting transistor 50 being turned on, while, the gate voltage Sel of the data-selecting transistor 70 is set at LOW, thus the transistor 70 being turned off.

When varying the amplitude of each differential amplifier, the gate voltage Vbias2 of the transistor 50 is set at LOW, while, the gate voltage Sel of the transistor 70 is set at HIGH to make the current supply transistor 60 execute data writing. During data writing, a writing voltage applied to each differential amplifier, or the writing voltage Vwrt to the transistor 60 is controlled to set the amplitude of each differential amplifier at a desired level.

An output signal $I_{OUT}$ of the filter circuit is an addition of a signal $I_{out}$ obtained by amplifying a first input signal $V_{in}$ by the first differential amplifier 80; a signal obtained by amplifying a second input signal by the second differential amplifier 81, the second input signal being obtained by delaying the input signal $V_{in}$ by a predetermined period of time Δt by the delay circuit 91; a signal obtained by amplifying a third input signal by a differential amplifier 82 (not shown), the third input signal being obtained by delaying the output signal of the delay circuit 92 by the period of time Δt by a delay circuit 93 (not shown); and a signal obtained by amplifying a fourth input signal by the differential amplifier 8N, the fourth input signal being obtained by delaying the output signal of a delay circuit 9N-1 (not shown) by the period of time Δt by the delay circuit 9N.

FIG. 4 explains the operation of the filter circuit shown in FIG. 3. In the figure, reference characters Iin, Out, $a_0$ to $a_n$ and Δt denote the input current, output signal, amplifiers and delay time, respectively.

The Z—transformation of the output signal yields the following formula.

$$\mathrm{Out}(z) = \sum_{i=o}^{n} ai \times Iin(Z^{-i})$$

Therefore, the operation described above corresponds to that of an analog finite impulse response (FIR) filter of discrete time system that makes the output signal discrete in the time direction only. The FIR filter is a basic filter and so the filter circuit as the second embodiment can be widely used in signal processing.

A variety of filtering characteristics of the filter circuit shown in FIG. 3 can be provided by varying the amplitude of the differential amplifiers 80 to 8N. This means that a single filter circuit of FIG. 3 can achieve a variety of signal processing, thus simplifying circuit configuration.

The first and second embodiments employ a programmable amplifier with a threshold voltage-variable non-volatile transistor according to the present invention as a differential amplifier. No only this, the programmable amplifier can be used for other amplifying circuits.

Described below are high frequency circuits with the programmable amplifier according to the present invention.

Figure 5:
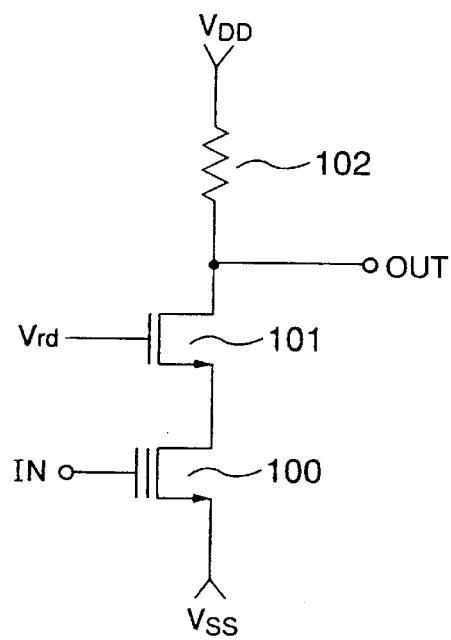
FIG. 5 is a circuit diagram showing essential portions of a high frequency amplifying circuit as the third preferred embodiment according to the present invention.

In FIG. 5 that shows the third embodiment, the source of a threshold voltage-variable non-volatile NMOS transistor 100 is connected to a constant voltage supply Vas. The drain of the transistor 100 is connected to the source of an NMOS transistor 101. The drain of the transistor 101 is connected to a terminal of a load resistor 102. The other terminal of the resistor 102 is connected to a constant voltage supply Vd.

A high frequency signal applied to the gate of the threshold voltage-variable non-volatile NMOS transistor 100 is output from the intersection of the transistor 101 and the load resistor 102.

A constant voltage Vrd is applied to the gate of the transistor 101 to prevent the drain voltage of the transistor 100 from increasing. This restricts the variation of the threshold voltage of the transistor 100, that is, the variation of the amplitude. In the FIG. 5, another non-volatile transistor can be provided instead of the load resistor 102.

Figure 6:
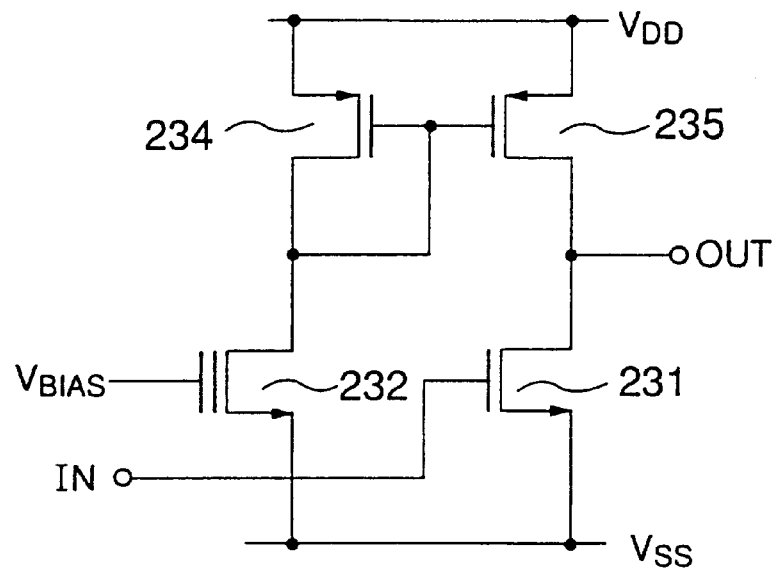
FIG. 6 is a circuit diagram showing essential portions of a high frequency amplifying circuit as the fourth preferred embodiment according to the present invention.
Figure 7:
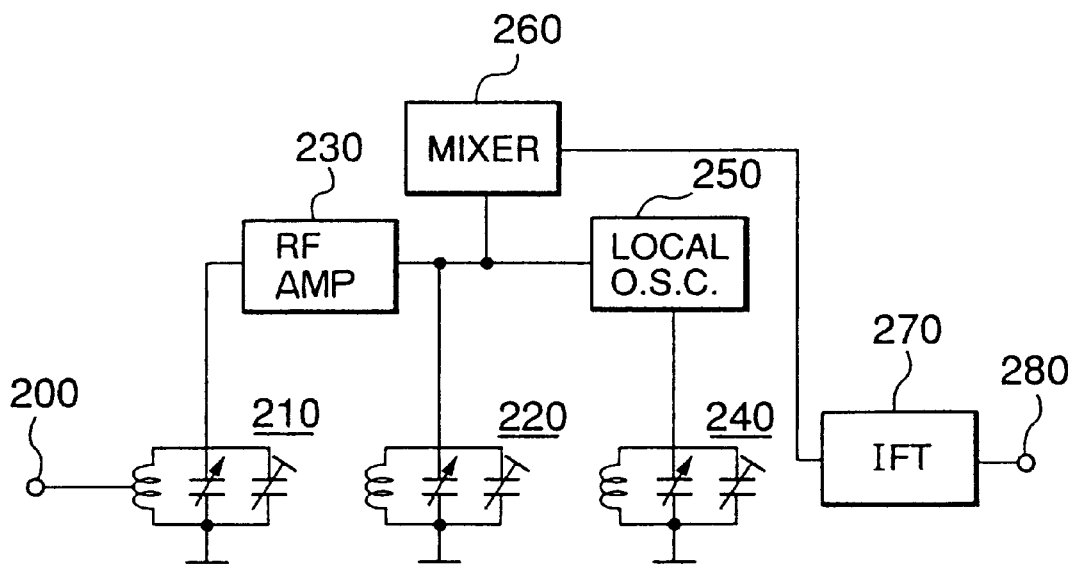
FIG. 7 is a block diagram showing a high frequency circuit using the high frequency amplifying circuit of FIG. 6.

In FIGS. 6 and 7 that show the fourth embodiment, an amplifying circuit shown in FIG. 6 is employed as a radio frequency (RF) amplifier 260 shown in FIG. 7.

In FIG. 6, the source of an NMOS output transistor 231 is connected to a constant voltage supply Vas. The drain of the transistor 231 is connected to the drain of a PMOS transistor 235. The source of the transistor 235 is connected to a constant voltage supply Vd. The gate of the transistor 235 is connected to the gate of a PMOS transistor 234.

The source of the transistor 234 is connected to the constant voltage supply Vd. The drain and gate of the transistor 234 are connected to the drain of a threshold voltage-variable non-volatile NMOS transistor 232. The source of the transistor 232 is connected to the constant voltage supply Vas.

The transistors 234 and 235 form a transistor pair (a current-mirror circuit) as an active load of the output transistor 231. The transistors 234 and 235 can be of non-volatile type.

In FIG. 7, a high frequency signal applied to an input terminal 200 is amplified with frequency selection by an antenna tuning circuit 210, a RF tuning circuit 220 and the RF amplifier 230.

An output signal of the RF amplifier 230 is applied to a mixer 260 with an output signal of a local oscillator 250 tuned by a local oscillator tuning circuit 240.

An intermediate frequency output signal of the mixer 260 is output from an output terminal 280 via an intermediate frequency filter (IFT) 270.

The high frequency signal applied to the gate of the output transistor 231 of the RF amplifier 230 shown in FIG. 6 from the antenna tuning circuit 210 is output from the drain of the transistor 231. The amplitude of the RF amplifier 230 is varied by varying a bias voltage Vbias applied to the gate of the threshold voltage-variable non-volatile NMOS transistor 232.

The PMOS and NMOS transistors in FIGS. 5 and 6 can be replaced with each other. In this case, the constant voltage supplies Vd and Vas are also replaced with each other.

As described above, a feature of the present invention is that a threshold hold voltage-variable non-volatile transistor is used for varying (programming) the amplitude of an amplifier.

The Japanese Patent Laid-Open No. 1988(63)-81852 discloses a MOS transistor that is programmable by controlling an amount of current flowing through the source and drain by means of an impurity doped region that prevents formation of an inversion layer and is formed in a part of a channel region. However, the Japanese laid open patent does not disclose usage of the MOS transistor for programming the amplitude of an amplifier.

The Japanese Patent Laid-Open Nos. 1990(2)-260298 and 1994(6)-268181 disclose non-volatile transistor threshold voltage control for multilevel memories. However, the Japanese laid-open patents do not disclose usage of the threshold voltage-variable non-volatile transistor for programming the amplitude of an amplifier.

The first and second embodiments employ a non-volatile transistor with a floating gate. Not only the transistor with the floating gate, any non-volatile transistor, such as, a memory cell transistor can be used. The memory cell transistor may be MNOS, mask ROM, EEPROM, EPROM, PROM, flush non-volatile memory and so on.

Further, the scope of the present invention includes the following case: the program codes of software for achieving the functions as disclosed by the preferred embodiments according to the present invention are supplied to a system or a computer connected to various devices activated so as to achieve those functions. Further, the above-mentioned devices are activated in accordance with a program stored in the system or the computer (CPU or MPU).

Further, in this case, the program codes themselves of the software can achieve the functions of the preferred embodiments according to the present invention. The program codes themselves and means for supplying the program codes to the computer, such as a storage medium 74 shown in FIG. 2 for storing the program codes are included in the scope of the present invention.

That is, the program codes stored in the storage medium 74 are read by a recording and reproducing apparatus 73 shown in FIG. 2 connected to the bias voltage generator 71 and the writing voltage generator 72, so that the computer constituting the generators 71 and 72 can be activated. Further, as the storage medium 74 for recording these programs and codes, there are a floppy disk, a hard disk, an optical disk, magneto-optical disk, a CD-ROM, a magnetic tape, a non-volatile memory card, a ROM, etc.

As described above, the present invention employs a non-volatile transistor as a control current supply device, thus achieving a programmable amplifier with a simple configuration. Further, the present invention provides a transistor between the amplifier and the non-volatile transistor to restrict variation of the threshold voltage, or amplitude of the non-volatile transistor, thus achieving a high-speed signal processing circuit with small signal variation.

Further, the present invention provides a differential amplifier with the programmable amplifier, thus achieving an amplitude-variable audio signal processing circuit, etc. Further, the present invention provides a plurality of series-connected differential amplifiers with the programmable amplifiers, thus achieving a filter with a desired characteristics by varying the amplitude of the differential amplifiers.

Further, the first and second embodiments disclose an application of a threshold voltage-variable non-volatile transistor for an amplifier. However, not only this, the threshold voltage-variable non-volatile transistor can be used as a variable resistor in an analog circuit, thus achieving easier analog circuit integration.

What is claimed is:

1. A semiconductor device comprising:
    a first differential amplifier including a first and a second transistor forming an input differential pair, the first transistor having a first gate and a pair of conductive areas of a first and a second conductive area, the second transistor having a second gate and a pair of conductive areas of a third and a fourth conductive area;
    a first current mirror circuit including a third and a fourth transistor, the third transistor having a third gate and a pair of conductive areas of a fifth and a sixth conductive area, the fourth transistor having a fourth gate and a pair of conductive areas of a seventh and an eighth conductive area; and
    a first control current supply circuit including a first non-volatile memory transistor having a first control gate, a first charge accumulating layer and a pair of conductive areas of a ninth and a tenth conductive area,
    wherein the first and the fifth conductive areas and the third and the fourth gates are connected to each other via a first wiring layer,
    the third and the seventh conductive areas are connected to each other via a second wiring layer,
    the sixth and the eighth conductive areas are connected to a first constant voltage supply via a third wiring layer, and
    the second and the fourth conductive areas are connected to a second constant voltage supply via at least a fourth wiring layer, the first control current supply circuit and a fifth wiring layer.

2. The semiconductor device according to claim 1, wherein the ninth conductive area is connected to the second and the fourth conductive areas via the fourth wiring layer, and the tenth conductive area is connected to the second constant voltage supply via the fifth wiring layer.

3. The semiconductor device according to claim 1, wherein one of the first and the second conductive areas functions as a source, while the other functions as a drain, one of the third and the fourth conductive areas functions as a source, while the other functions as a drain, one of the fifth and the sixth conductive areas functions as a source, while the other functions as a drain, one of the seventh and the eighth conductive areas functions as a source, while the other functions as a drain, and one of the ninth and the tenth conductive areas functions as a source, while the other functions as a drain.

4. The semiconductor device according to claim 1 further comprising:
    a second differential amplifier including a fifth and a sixth transistor forming an input differential pair, the fifth transistor having a fifth gate and a pair of conductive areas of an eleventh and a twelfth conductive area, the sixth transistor having a sixth gate and a pair of conductive areas of a thirteenth and a fourteenth conductive area; and
    a second current mirror circuit including a seventh and an eighth transistor, the seventh transistor having a seventh gate and a pair of conductive areas of a fifteenth and a sixteenth conductive area, the eighth transistor having an eighth gate and a pair of conductive areas of a seventeenth and an eighteenth conductive area,
    wherein the eleventh and the fifteenth conductive areas and the seventh and the eighth gates are connected to each other via a sixth wiring layer,
    the thirteenth and the seventeenth conductive areas are connected to each other via a seventh wiring layer,
    the sixteenth and the eighteenth conductive areas are connected to a third constant voltage supply via an eighth wiring layer,
    the twelfth and the fourteenth conductive areas are connected to a fourth constant voltage supply via at least a ninth wiring layer, a second control current supply circuit and a tenth wiring layer, and
    the first and the fifth gates are connected to each other via a delay circuit.

5. The semiconductor device according to claim 4, wherein the ninth conductive area is connected to the second and the fourth conductive areas via the fourth wiring layer, the tenth conductive area is connected to the second constant voltage supply via the fifth wiring layer, and the second control current supply circuit including a second non-volatile memory transistor having a second control gate, a second charge accumulating layer and a pair of conductive areas of a nineteenth and a twentieth conductive area.

6. The semiconductor device according to claim 5, wherein the nineteenth conductive area is connected to the twelfth and the fourteenth conductive areas via at least the ninth wiring layer, and the twentieth conductive area is connected to the fourth constant voltage supply via at least the tenth wiring layer.

7. The semiconductor device according to claim 1, wherein at least either the first or the second gate is connected to a delay circuit.

8. The semiconductor device according to claim 4, wherein the second wiring layer is connected to the seventh wiring layer via an eleventh wiring layer.

9. The semiconductor device according to claim 1 further comprising means for varying a threshold voltage of the first non-volatile memory transistor.

10. A semiconductor device comprising:
   a differential amplifier including a transistor having a gate and a first pair of conductive areas;
   a control current supply circuit including a non-volatile memory transistor having a control gate, a charge accumulating layer and a second pair of conductive areas; and
   means for varying a threshold voltage of the non-volatile memory transistor,
   wherein one conductive area of the first pair is connected to a constant voltage supply via at least a first wiring layer, the control current supply circuit and a second wiring layer.

11. The semiconductor device according to claim 1, wherein at least either the first or the second transistor is a non-volatile transistor.

12. The semiconductor device according to claim 4, wherein at least either the first, the second, the fifth or the sixth transistor is a non-volatile transistor.

13. The semiconductor device according to claim 10, wherein the transistors is a non-volatile memory transistor.

14. A semiconductor device comprising:
   a pair of differential input transistors connected to each other as input transistors of a differential amplifier so as to differentially amplify an input signal; and
   a current supply having a non-volatile memory transistor, for supplying a current which is split between said input transistors according to said differential input signal, said non-volatile memory transistor having a threshold voltage-variable gate which controls the amplification of said input signal.

15. The semiconductor device according to claim 14, wherein at least either of the differential input transistors is a non-volatile memory transistor.

16. The semiconductor device according to claim 14 further comprising a first transistor connected between the differential input transistors and the non-volatile memory transistor of the current supply, the first transistor restricting an increase of a drain voltage of the non-volatile memory transistor.

17. The semiconductor device according to claim 16, wherein the non-volatile memory transistor and the first transistor are connected to each other via a second transistor.

18. The semiconductor device according to claim 1 further comprising means for varying a threshold voltage of the first non-volatile memory transistor.

19. The semiconductor device according to claim 1 further comprising voltage applying means for applying predetermined voltages to the first control gate, and the first and the second conductive areas, the voltage applying means having means for changing, in a stepwise fashion, status of charges in the charge accumulating layer.

20. A semiconductor device comprising:
   an amplifier;
   varying means for varying amplitude of the amplifier, the varying means including a memory transistor having a control gate, a charge accumulating layer, a source and a drain; and
   applying means for applying predetermined voltages to the control gate, the source and the drain, the applying means including means for changing, in a stepwise fashion, status of charges in the charge accumulating layer.

21. A semiconductor device comprising:
   a variable resistor including a memory transistor having a control gate, a charge accumulating layer, a source and a drain; and
   applying means for applying predetermined voltages to the control gate, the source and the drain, the applying means including means for changing, in a stepwise fashion, status of charges in the charge accumulating layer.

22. The semiconductor device according to claim 20, wherein the memory transistor is either an MNOS type, a mask ROM type, an EEPROM type, an EPROM type, a PROM type or a flush non-volatile memory.

23. The semiconductor device according to claim 1 further comprising a read protecting transistor having a ninth gate and a pair of conductive areas of a twenty-first and a twenty-second conductive area, wherein the second, the fourth and the twenty-first conductive areas are connected to each other via at least the fourth wiring layer, and the ninth conductive area is connected to the twenty-second conductive area via at least a twelfth wiring layer.

24. The semiconductor device according to claim 1 further comprising:
   a read protecting transistor having a ninth gate and a pair of conductive areas of a twenty-first and a twenty-second conductive area; and
   a selecting transistor having a tenth gate and a pair of conductive areas of a twenty-third and a twenty-fourth conductive area,
   wherein the second, the fourth and the twenty-first conductive areas are connected to each other via the fourth wiring layer,
   the twenty-second and the twenty-third conductive areas are connected to each other via a twelfth wiring layer, and
   the ninth and the twenty-fourth conductive areas are connected to each other via a thirteenth wiring layer.

25. A semiconductor device comprising an amplifier including a non-volatile memory transistor having a control gate, a charge accumulating layer and a pair of conductive areas of a first and a second conductive area.

26. The semiconductor device according to claim 25 further comprising a read protecting transistor having a gate and a pair of conductive areas of a third and a fourth conductive area,
   wherein the first and the fourth conductive areas are connected to each other via a first wiring layer,
   the second conductive area is connected to a first constant voltage supply via at least a second wiring layer, and
   the third conductive area is connected to a second voltage supply via at least a third wiring layer.

27. A semiconductor device comprising:

an amplifier including a non-volatile memory transistor and a first transistor, the non-volatile memory transistor having a control gate, a charge accumulating layer and a pair of conductive areas of a first and a second conductive area, and the first transistor having a first gate and a pair of conductive areas of a third and a fourth conductive area; and a current mirror circuit including a second transistor and a third transistor, the second transistor having a second gate and a pair of conductive areas of a fifth and a sixth conductive area, and the third transistor having a third gate and a pair of conductive areas of a seventh and a eighth conductive area, wherein the first and the sixth conductive areas and the second and the third gates are connected to each other via a first wiring layer, the third and the eighth conductive areas are connected to each other via a second wiring layer, the fifth and the seventh conductive areas are connected to a first constant voltage supply via at least a third wiring layer, and the second and the fourth conductive areas are connected to a second voltage supply via at least a fourth wiring layer.

28. The semiconductor device according to claim 27 further comprising a tuner whose output terminal is connected to the first gate via at least a fifth wiring layer, wherein the amplifier functions as a high frequency amplifier.

29. A semiconductor device comprising a differential amplifier which includes:

differential input transistors connected so as to differentially amplify two input signals; and a current supply transistor connected to the differential input transistors, wherein the current supply transistor is a non-volatile memory transistor.

30. The semiconductor device according to claim 29, wherein the non-volatile memory transistor has a floating gate.

31. The semiconductor device according to claim 29, wherein the differential input transistors are non-volatile memory transistors.

32. The semiconductor device according to claim 31, wherein each non-volatile memory transistor has a floating gate.

33. The semiconductor device according to claim 29, wherein the differential input transistors and the current supply transistor are connected to each other via a read-protecting transistor.

34. The semiconductor device according to claim 33, wherein the current supply transistor and the read-protecting transistor are connected to each other via a selecting transistor.

35. An amplifying circuit comprising:

a differential amplifier including a first and a second transistor forming an input differential pair, the first transistor having a first gate and a pair of conductive areas of a first and a second conductive area, the second transistor having a second gate and a pair of conductive areas of a third and a fourth conductive area; and a current mirror circuit acting as an active load of the differential amplifier, including a third and a fourth transistor, the third transistor having a third gate and a pair of conductive areas of a fifth and a sixth conductive area, the fourth transistor having a fourth gate and a pair of conductive areas of a seventh and an eighth conductive area, wherein the first and the fifth conductive areas and the third and the fourth gates are connected to each other via a first wiring layer, the third and the seventh conductive areas are connected to each other via a second wiring layer, the sixth and the eighth conductive areas are connected to a first constant voltage supply via a third wiring layer, the second and the fourth conductive areas are connected to a second constant voltage supply via at least a fourth wiring layer, a non-volatile memory transistor acting as a control current supplying device and a fifth wiring layer, and a sixth wiring layer for outputting a current is connected to the third conductive area.

36. The semiconductor device according to claim 35, wherein the non-volatile memory transistor includes a control gate, a charge accumulating layer and a pair of conductive areas of a ninth and a tenth conductive area.

37. The semiconductor device according to claim 35 further comprising a read protecting transistor including a pair of conductive areas of an eleventh and a twelfth diffusion layer, wherein the second and the fourth conductive areas are connected to the eleventh diffusion layer via the fourth wiring layer, the twelfth conductive area is connected to the ninth conductive area via a six wiring layer.

38. The semiconductor device according to claim 36 further comprising a selecting transistor including a pair of conductive areas of a thirteenth and a fourteenth diffusion layer, wherein the ninth conductive area is connected to the thirteenth diffusion layer via a seventh wiring layer.

39. A method of varying amplitude of a semiconductor having differential input transistors connected so as to differentially amplify two input signals, a non-volatile memory transistor as a current supply transistor connected to the differential input transistors and a selecting transistor connected between the differential input transistors and the current supply transistor, the method comprising the steps of:

applying a first predetermined voltage to a gate of the current supply transistor; and applying a second predetermined voltage to either of two conductive areas of the selecting transistor, thus varying a threshold level of the current supply transistor.

40. The method according to claim 39 further comprising the step of varying, in a stepwise fashion, the second predetermined voltage to change, in a stepwise fashion, status of charges in a charge accumulating layer of the current supply transistor.

41. A computer readable medium storing program code means for causing a computer to vary amplitude of a semiconductor having differential input transistors connected so as to differentially amplify two input signals, a non-volatile memory transistor as a current supply transistor connected to the differential input transistors and a selecting transistor connected between the differential input transistors and the current supply transistor, comprising:

first program code means for applying a first predetermined voltage to a gate of the current supply transistor; and second program code means for applying a second predetermined voltage to either of two conductive areas of the selecting transistor, thus varying a threshold level of the current supply transistor.

42. The computer readable medium according to claim 41 further comprising a third program code means for varying, in a stepwise fashion, the second predetermined voltage to change, in a stepwise fashion, status of charges in a charge accumulating layer of the current supply transistor.

* * * * *